United States Patent [19]
Barnett et al.

[11] Patent Number: 5,395,704
[45] Date of Patent: Mar. 7, 1995

[54] SOLID-OXIDE FUEL CELLS
[75] Inventors: Scott A. Barnett; Li-Shun Wang, both of Evanston, Ill.
[73] Assignee: North Western Univ. Technology Transfer Prog., Evanston, Ill.
[21] Appl. No.: 978,863
[22] Filed: Nov. 19, 1992
[51] Int. Cl.[6] .............................................. H01M 8/10
[52] U.S. Cl. ........................................ 429/30; 429/33; 429/40; 429/44
[58] Field of Search .................. 424/30, 33, 40, 44

[56] References Cited
U.S. PATENT DOCUMENTS

| 4,040,929 | 8/1977 | Bauer et al. . |
| 4,459,341 | 7/1984 | Marchant et al. . |
| 4,582,766 | 4/1986 | Isenberg et al. ............... 429/30 |
| 4,702,971 | 10/1987 | Isenberg . |
| 4,767,518 | 8/1988 | Maskalick . |
| 4,789,561 | 12/1988 | Schaefer et al. . |
| 4,802,958 | 2/1989 | Mazanec et al. ............... 204/80 |
| 4,810,350 | 3/1989 | Mantese et al. . |
| 4,826,808 | 5/1989 | Yurek et al. . |
| 4,842,704 | 6/1989 | Collins et al. . |
| 4,894,297 | 1/1990 | Singh et al. . |
| 4,902,671 | 2/1990 | Koinuma et al. . |
| 4,939,041 | 7/1990 | Kabacoff et al. . |
| 5,035,962 | 7/1991 | Jensen . |
| 5,037,525 | 8/1991 | Badwal ............................ 204/421 |
| 5,049,452 | 4/1991 | Takeshita et al. . |
| 5,057,201 | 10/1991 | Fujita et al. . |
| 5,217,822 | 6/1993 | Yoshida et al. .................. 429/33 |
| 5,234,722 | 8/1993 | Ito et al. .......................... 427/453 |

Primary Examiner—Prince Willis, Jr.
Assistant Examiner—M. Nuzzolillo
Attorney, Agent, or Firm—Hughes, Multer & Schacht

[57] ABSTRACT

Fuel cells which have a solid-oxide, thin film electrolyte and thin film cermet air and fuel electrodes. Processes for manufacturing thin film fuel cells in which air electrode, electrolyte, and fuel electrode films are deposited on a porous refractory substrate by magnetron sputtering.

9 Claims, 2 Drawing Sheets

ND'S SCIENTIFIC ENCYCLO-
SOLID-OXIDE FUEL CELLS

RELATION TO OTHER APPLICATIONS

Application No. 07/978,927 filed Nov. 19, 1992, and application No. 07/979,002 filed Nov. 19, 1992 are related and are hereby incorporated by reference.

TECHNICAL FIELD OF THE INVENTION

The present invention relates to novel solid-oxide fuel cells (SOFC'S) and to novel processes for manufacturing SOFC'S.

BACKGROUND OF THE INVENTION

The need for a safe, pollution-free, highly flexible power generation technology has caused increasing interest in fuel cells.

Fuel cells were invented in 1839 by Sir William Grove. A fuel cell is an electrochemical device which directly combines a fuel and an oxidant such as hydrogen and oxygen to produce electricity and water. It has an anode or fuel electrode and a cathode or air electrode separated by an electrolyte. Hydrogen is oxidized to hydrated protons on the anode with an accompanying release of electrons. At the anode, oxygen reacts with protons to form water, consuming electrons in the process. Electrons flow from the anode to the cathode through an external load, and the circuit is completed by ionic current transport through the electrolyte.

Fuel cells do not pollute the environment. They operate quietly, and high temperature fuel cells have a potential efficiency of ca. 80 percent. Virtually any natural or synthetic fuel from which hydrogen can be extracted—by steam reforming, for example—can be employed.

Of current interest because they do not have the handling problems of liquid fuel cell electrolytes are solid oxide fuel cells (SOFC'S) which have a solid, stabilized-zirconia electrolyte and operate at a temperature of 1000° C. While efficient, reliable solid oxide fuel cells are available, the cost per kilowatt of electricity generated by those SOFC'S is presently too high for most commercial applications. The high cost of the cells is due in part to the specialized processes used for cell fabrication, which are relatively slow and expensive. High SOFC cost is also related to the materials problems associated with the conventional SOFC operating temperature of $\approx$ 1000° C.

Many studies have been made of SOFC electrolyte materials with higher conductivity than the conventional yttria-stabilized zirconia (YSZ). These materials would permit SOFC operation at lower temperatures, 600° to 800° C. It has also been suggested that a SOFC with a thin film YSZ electrolyte could operate efficiently in this temperature range. In addition to allowing lower operating temperatures, thin film SOFC's could be produced at lower cost if a satisfactory large-scale thin film deposition technique were available.

SUMMARY OF THE INVENTION

It has now been discovered that reactive magnetron sputtering is a continuous, thin film deposition process that admirably lends itself to the manufacture of SOFC'S. In the novel SOFC manufacturing process disclosed herein, this technique is employed to deposit a thin film air electrode on a porous refractory substrate, to deposit a thin film solid-oxide electrolyte on the air electrode, and to deposit a thin film fuel electrode on the solid-oxide electrolyte. The process is economical, can be employed in a continuous manner and at low temperatures, and can be used to fabricate SOFC'S of large areas in quantity and at high rates. Dense, crack-free films may be produced. These denser films have lower permeability and allow a thinner electrolytes to be used, which is advantageous from the cost and space savings standpoints.

In this regard, magnetron sputtering provides ion irradiation of the film during deposition. This has been shown to be crucial in obtaining high density films at low temperatures.

Typically, the solid-oxide electrolyte will be a yttria-stabilized zirconia (YSZ), the fuel electrode a nickel/YSZ cermet, and the air electrode one of the novel silver/YSZ cermets disclosed in companion application No. 07/979,002.

These novel, thin film SOFC'S are advantageous because of their efficiency at a moderate (600°–800° C.) temperature and because they can be manufactured in volume, at low cost, and in large sizes. Also, the Ag/YSZ air electrode makes the novel SOFC'S disclosed herein superior because these cermets have good catalytic properties, low resistivity, thermal stability, low thermal interfacial resistance with solid-oxide electrolytes, and a good thermal match with such electrolytes.

Other physical vapor deposition processes —evaporation and sputtering—can be employed instead of reactive magnetron cosputtering, if desired, as the basics of the processes and the structures of the films are similar. However, reactive magnetron sputtering is preferred because of the higher deposition rates that can be obtained.

The objects, advantages, and salient features of the present invention will be apparent to the reader from the foregoing and the appended claims and as the ensuing detailed description and discussion proceeds in conjunction with the accompanying drawings.

DETAILED DESCRIPTION OF THE INVENTION

Figure 1:
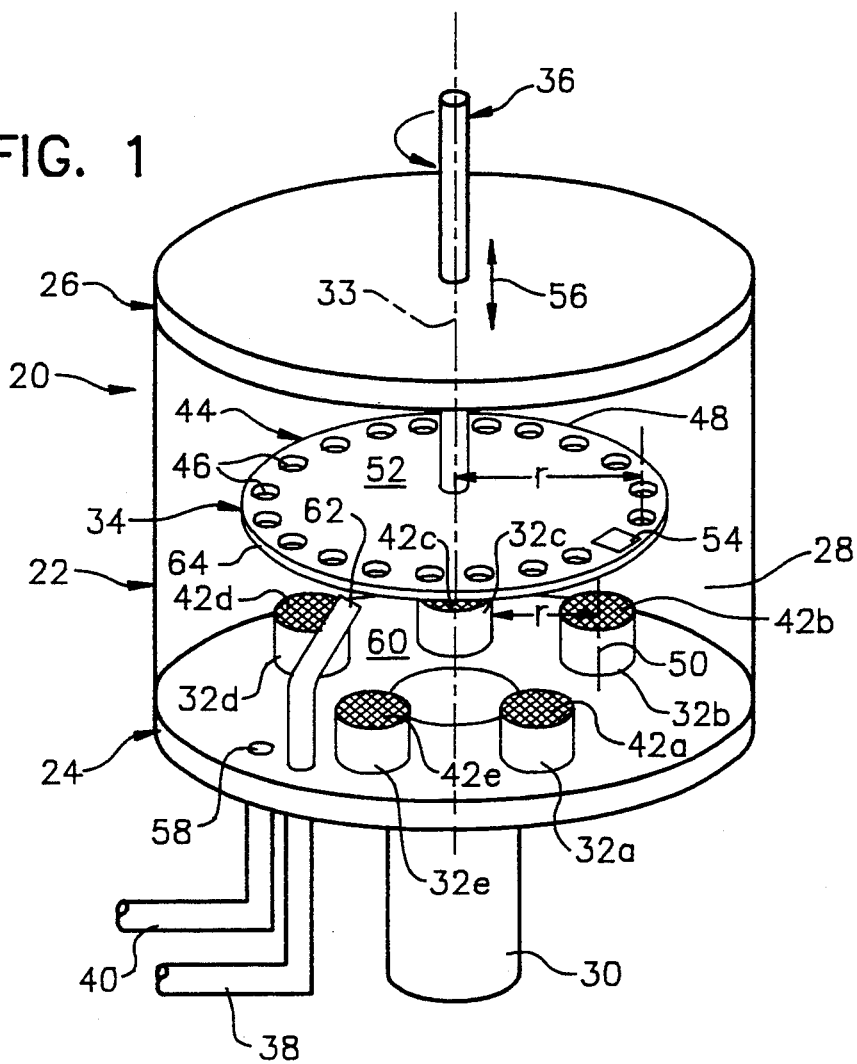
FIG. 1 is a schematic illustration of a system in which a fuel cell as illustrated in FIG. 2 can be fabricated.

As discussed above, the present invention relates to: (1) novel solid-oxide fuel cells with a yttria-stabilized zirconia electrolyte, and a nickel-YSZ fuel electrode, and a silver-YSZ air electrode; and (2) to novel processes for making those electrodes in which thin films of the air electrode cermet, the electrolyte, and the fuel electrode cermet are deposited in that order on a porous, refractory substrate.

Yttria-stabilized zirconia electrolytes and Ni-YSZ fuel electrodes for solid-oxide fuel cells are well-known (see, for example, hereby incorporated U.S. Pat. No. 3,503,809 issued Mar. 31, 1970 to Spacil for ELECTRICAL DEVICE INCLUDING NICKEL-CONTAINING STABILIZED ZIRCONIA ELECTRODE and in VAN NOSTRAND'S SCIENTIFIC ENCYCLO- PEDIA, Seventh Edition, Van Nostrand Reinhold, New York, N.Y., 1989, Vol. 1, pp. 1253, 1254).

The Ag-YSZ air electrodes are cermets of the formula $Ag_{1-f}YSZ_f$ where f is volume fraction and ranges from near zero (~0.05) to near 1.0 (~0.95). These novel cermets (described in more detail in companion application No. (Attorneys' Docket No. 1460) exhibit low resistivity and low interface resistance with YSZ electrolytes. The cermet film resistivity changes from insulating to metallic with increasing Ag content. For $f_{Ag}>0.4$, the cermets are highly conducting. For $f_{Ag}<0.4$, the resistivity increases very rapidly with decreasing Ag content. Annealed films with 50 vol. % Ag exhibit resistivities of 100 $\mu\Omega$ cm and good adherence to YSZ.

For $F_{Ag}<0.4$, $\rho$ decreases rapidly with increasing $f_{Ag}$. For $f_{Ag}>0.4$, $\rho$ decreases more gradually with increasing $f_{Ag}$. $\rho$ in annealed films ranges from $4\times 10^{-6}$ $\Omega$ cm for $f_{Ag}=0.4$ to $5\times 10^{-6}$ $\Omega$ cm for purge Ag.

For a silver volume fraction of 0.5, the 700° C. resistivity $\rho$ of the Ag/YSZ cermet as determined by four-point probe measurement is 175 $\mu\Omega$ cm. This is 10 to 100 times lower than the resistivity of commonly used perovskite fuel cell electrodes. At 750° C., the same cermet composition exhibits an interfacial resistance with YSZ of 1.4 $\Omega$ cm, a factor of 6 less than the resistance of pure Ag on YSZ. For a device operating in air at 750° C., the current density limited by the interface resistance is thus ~250 mA/cm$^2$, and the electrode ohmic loss is negligible.

Preferred are those cermets with stoichiometric YSZ; i.e., cermets with a nominal formula $\sim Ag_{1-f}[(Y_2O_3)_{0.1}(ZrO_2)_{0.9}]_f$. It is not essential, however, that YSZ's of this particular composition be selected. Companion application No. 07/978,927, for example, discloses yttria-stabilized zirconias with normalized oxygen to metal ratios ranging from ~0.1 to ~1.0. These and other YSZ's, many of which are commercially available, can be employed instead as appropriate.

Representative and particularly important are those cermets with $f_{Ag}=0.5$. Cermets of that composition have a resistivity which is 10–100 greater than that of perovskite electrode materials and are promising candidates for the air electrodes in SOFC's operating at moderate (750° C.) temperatures. The interface resistance $r_i=1.4$ $\Omega$ cm$^2$ on YSZ electrolytes at 750° C. allows SOFC current densities J approaching 250 mA/cm$^2$ to be achieved.

The cermet electrode thickness required for a SOFC can be estimated using equation 1

$$V_{ci}=J\rho L^2/2t_f \quad (1)$$

where J is cell current density, $\rho$ is the area of the air electrode, $<_2$ is the film resistivity of the cermet, and t is the thickness of the electrode.

The thin film electrolyte and the air and fuel electrodes can be deposited or synthesized on the fuel cell support by magnetron sputtering and cosputtering. One system which can be employed for these purposes is illustrated in FIG. 1 and identified by reference character 20.

System 20 includes a cylindrical glass bell jar 22, a base plate 24, and a top plate 26. Plates 24 and 26 are typically made of steel and cooperate with bell jar 22 to form an evacuatable reaction chamber 28. Also present in system 20 are: a turbomolecular pump 30; a circular array of five conventional magnetron sputter sources 32a–e supported on base plate 24 and centered on longitudinal axis 33 of system 20; a sample holder tray/shutter 34 supported in bell jar 22 on a rotary/linear motion feedthrough 36 which rotates about axis 33; and inlet lines 38 and 40 for oxygen and an inert gas, preferably argon.

Turbomolecular pump 30, typically operated at a constant pumping speed of 145 l/s, is employed to evacuate reaction chamber 28.

Magnetron sputtering sources 32a–32e have 5 cm diameter sputtering targets 42a–42e. Multiple sources have the advantage that the thin film air electrode, electrolyte, and fuel electrode can be deposited upon a support in a single pumpdown (cycle of operation) of chamber 28.

Substrate holder 34, typically fabricated from aluminum, has a set 44 of apertures 46 spaced equidistantly around and adjacent its periphery 48. The illustrated system has 20 apertures 46. Therefore, films can be deposited on up to 20 separate fuel cell supports with a single pumpdown of reaction chamber 28. The centers of apertures 46 are located at the same distance r from axis 33 as the longitudinal centerlines 50a–e of magnetron sputter sources 32a–32e.

The porous refractory supports on which the fuel cells are fabricated are mounted on the upper surface 52 of support 34 in overlying relationship to apertures 46 (one of these supports is depicted pictorially in FIG. 1 and identified by reference character 54). By rotating substrate holder/shutter 34 about axis 33, a selected fuel cell support 54 can accordingly be aligned directly above the target 42a–e of a selected magnetron sputtering source 32a–32e.

The linear, arrow 56 motion of feedthrough 36 allows the distance between the sputtering targets 42a–e of sources 32a–e and the fuel cell support 54 being treated to be optimized. In the illustrated system, this distance can be varied between 5 and 22 cm.

The outlet 58 of argon inlet tube 40 is typically coincident with the upper surface 60 of steel base plate 24. Oxygen inlet tube 38 extends upwardly through reaction chamber 28 to an outlet 62 adjacent the lower side 64 of substrate holder/shutter 34. This ensures that oxide-forming oxygen introduced into the reaction chamber will be intimately mixed with metals released from the sputtering targets 42a–e of the operating magnetron sputtering sources 32a–e.

The magnetrons of system 20 have been operated at a power of 150 W. This yields deposition rates of up to 4 $\mu$m/hr. Much higher deposition rates exceeding 15 $\mu$m/hr can be obtained by using larger area magnetron sources and higher powers.

Preferred sputtering gases are 99.999% pure oxygen and 99.999% pure argon. Reaction chamber 28 is pumped to a base pressure of $\approx 1\times 10^{-6}$ Torr before backfilling the chamber with Ar-O$_2$. The oxygen is discharged from outlet 62 of oxygen supply tube 38 at a flow rate of 2.0 ml/min (typically). The oxygen pressure may vary depending upon the gettering rate of the sputtered reactive metals.

Total pressures of 5–20 mTorr have been employed. The deposition conditions can be such that the YSZ component in the films will be fully oxidized. Film densities vary from $\approx 75\%$ to $>85\%$ as the total pressure decreases from 20 to 5 mTorr.

Targets are sputtered in pure Ar prior to deposition for 10 to 15 min to remove oxides, using a shutter (not shown) to cover the fuel cell supports. The oxygen flow is then started, and sputtering is continued for 10 min to reach a steady state condition before removing the shutter to initiate deposition of the electrodes and electrolyte on the fuel cell support 54.

The porous refractory supports were not heated intentionally before or during deposition of the air and fuel electrodes and the electrolyte.

In a typical application of system 20 to the manufacture of a fuel cell employing the principles of the present invention: the targets 42a and 42b of sputtering sources 32a and 32b are Ag and Y-Zr and are employed in synthesizing the Ag-YSZ air electrode, target 42c is Y-Zr and is employed in synthesizing the YSZ electrolyte, and targets 32d and 32e are respectively nickel and Y-Zr and utilized in depositing the fuel cell electrode.

The sputtering targets 42a-e utilized in system 20 are 5 cm in diameter. The Y-Zr targets are made from a 3 mm thick, 99.9% pure Zr disc. A strip of 99.9% pure Y metal, 0.81 cm wide and 0.16 cm thick, is placed in a slot machined across the diameter of the Zr disc. The width of the Y strip is selected to give an area ratio of Y to Zr in the eroded portion of the target (a circular track 2.9 cm in diameter and $\sim 1$ cm in width) of 1:4. Assuming equal sputtering rates for Y and Zr, this gives a film composition of $(Y_2O_3)_{0.11}(ZrO_2)_{0.89}$. This closely approximates the stoichiometric composition giving the highest conductivity in YSZ.

For the Ag magnetron sputtering source 32a, the applied voltage can be 385 V and the current 0.1 A. The Zr-Y sputtering source 32b magnetron can be operated at 380 V and 0.4 A. These operating parameters produce fully oxidized YSZ without target oxidation, allowing high deposition rates.

Comparable operating parameters can be utilized to deposit the fuel electrode, and a current of 0.4 A is suitable for depositing the solid-oxide YSZ electrolyte.

Figure 2:
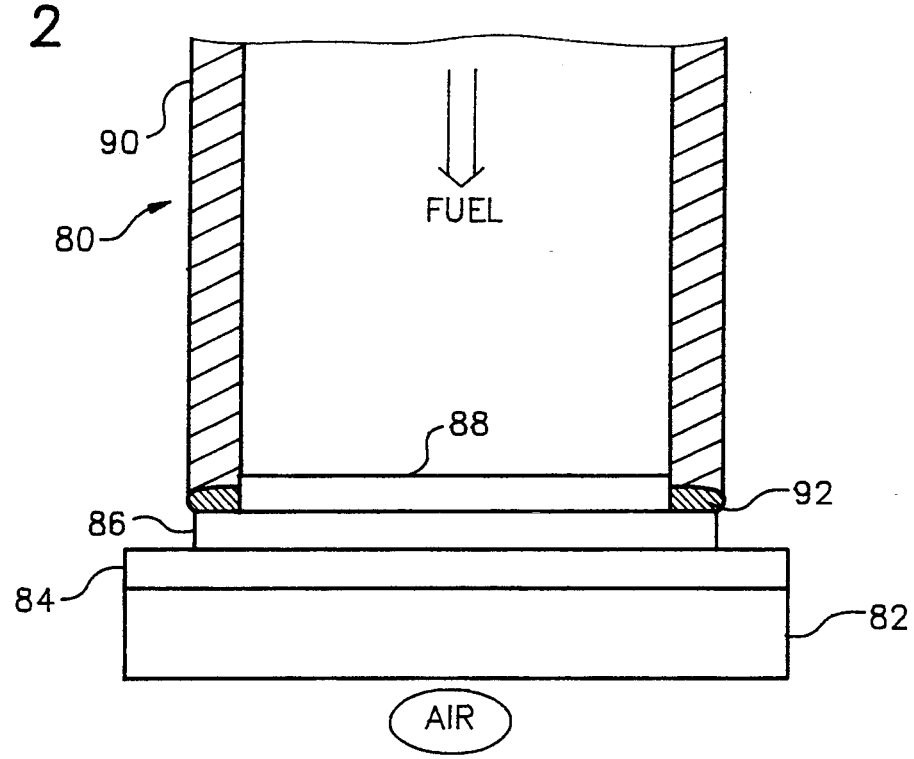
FIG. 2 is an schematic view of a solid-oxide fuel cell constructed in accord with, and embodying, the principles of the present invention.

Referring again to the drawing, FIG. 2 depicts a solid-oxide fuel cell 80 embodying the principles of the present invention and manufactured using magnetron sputtering and cosputtering as just-described to deposit thin films on a refractory, 28% porosity alumina support 82 with a 0.5 μm pore size. The first layer to be deposited was the air electrode 84, a 1 μm thick Ag-YSZ cermet with 50 vol % ($f=0.5_{Ag}$) Ag. The deposition rate was 2 μm/h. This material has a resistivity of $\approx 175$ μΩ cm at 700° C.

Next was the solid-oxide electrolyte 86, a 20 μm thick YSZ film deposited at a rate of 2.5 μm/h. The conductivity was the same as that for bulk YSZ.

The final layer to be deposited was the fuel electrode 88, a 1 μm thick Ni-YSZ cermet with 50 vol % ($f_{Ag}=0.5$) Ni. The deposition rate was 1 μm/h.

Contacts to the electrodes were made using Ag paste and Ag wires (not shown). Contact to the Ag-YSZ air electrode 84 was made at a point where the YSZ electrolyte and Ni-YSZ fuel electrode did not cover the air electrode.

The net cell area was 4 mm².

Fuel cell 80 was evaluated in a furnace with the back side of the alumina support 82 exposed to atmospheric-pressure air. The fuel gas was supplied to cell 80 through a dense alumina tube 90 that was sealed to the fuel electrode side with alumina high-temperature cement 92. The fuel gas was atmospheric-pressure hydrogen that had been bubbled through room-temperature water (i.e., 3% water).

Figure 3:
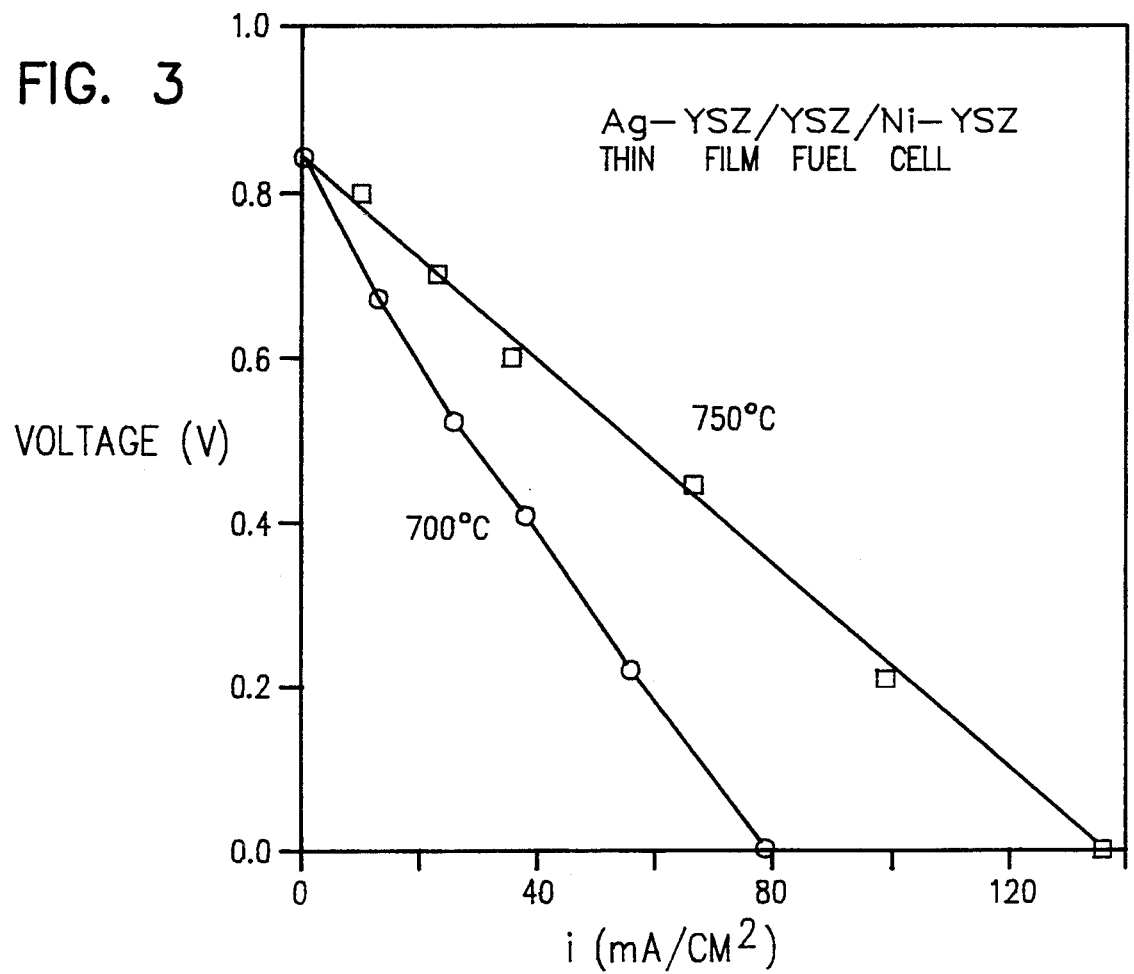
FIG. 3 is a graph showing the results obtained in operating a fuel cell as defined in FIG. 1.

FIG. 3 shows the cell current-voltage characteristics measured at 700° and 750° C. The open circuit voltage was 0.84 V. The characteristics were ohmic with cell resistances of 6.4 Ω cm² at 750° C. The maximum power density was $\approx 30$ mW/cm² at 750° C. The 750° C. power density is $\approx$ twice that reported for a previous thin film SOFC operated at the same temperature on a porous alumina support.

The cell open circuit voltage was slightly higher than the value for the thin film SOFC described in T. Kenjo, S. Osawa, and K. Fujikawa. J. Electrochem. Soc. 138, 3-9, 1991.

The invention may be embodied in many forms without departing from the spirit or essential characteristics of the invention. The present embodiments are therefore to be considered in all respects as illustrative and not restrictive, the scope of the invention being indicated by the appended claims rather than by the foregoing description; and all changes which come within the meaning and range of equivalency of the claims are therefore intended to be embraced therein.

What is claimed is:

1. A fuel cell comprising:
    a yttria-stabilized zirconia electrolyte;
    a cermet fuel electrode comprising a yttria-stabilized zirconia on and in intimate contact with one side of said electrolyte; and
    a cermet air electrode on and in intimate contact with the other side of the electrolyte, the air electrode cermet having the nominal formula $Ag_{1-f}YSZ_f$, where f is volume fraction and ranges from about 0.5 to about 0.95.

2. A fuel cell as defined in claim 1 in which the electrolyte and the fuel and air electrodes are thin films.

3. A fuel cell as defined in claim 1 which the electrolyte is composed of a yttria-stabilized zirconia.

4. A fuel cell as defined in claim 1 in which the volume fraction of silver in the air electrode cermet is at least 0.4.

5. A fuel cell as defined in claim 4 in which the volume fraction of silver in the air electrode cermet is about $\sim 0.5$.

6. A fuel cell as defined in claim 1 in which the fuel cell electrode cermet is composed of nickel and yttria-stabilized zirconia.

7. A fuel cell as defined in claim 6 in which the volume fraction of the nickel in the fuel electrode cermet is $\sim 0.5$.

8. The combination of a fuel cell as defined in claim 1 and a porous refractory support for said cell.

9. The combination defined in claim 8 in which the support is alumina.

* * * * *